United States Patent
Antonyan

(10) Patent No.: US 10,964,387 B2
(45) Date of Patent: *Mar. 30, 2021

(54) RESISTIVE MEMORY DEVICE INCLUDING REFERENCE CELL AND OPERATING METHOD THEREOF

(71) Applicant: Samsung Electronics Co., Ltd., Suwon-si (KR)

(72) Inventor: Artur Antonyan, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/800,081

(22) Filed: Feb. 25, 2020

(65) Prior Publication Data

US 2020/0194068 A1    Jun. 18, 2020

Related U.S. Application Data

(62) Division of application No. 16/131,575, filed on Sep. 14, 2018, now Pat. No. 10,622,066.

(30) Foreign Application Priority Data

Sep. 21, 2017  (KR) .......................... 10-2017-0121877
Feb. 20, 2018  (KR) .......................... 10-2018-0020016

(51) Int. Cl.
*G11C 13/00*     (2006.01)
*G11C 7/14*      (2006.01)
(Continued)

(52) U.S. Cl.
CPC .......... *G11C 13/0069* (2013.01); *G11C 7/062* (2013.01); *G11C 7/067* (2013.01); *G11C 7/08* (2013.01); *G11C 7/14* (2013.01); *G11C 11/15* (2013.01); *G11C 11/1673* (2013.01); *G11C 13/004* (2013.01); *G11C 11/1659* (2013.01); *G11C 11/1693* (2013.01);
(Continued)

(58) Field of Classification Search
CPC ................................................ G11C 13/0069
See application file for complete search history.

(56) References Cited

U.S. PATENT DOCUMENTS

| 6,341,084 B2 | 1/2002 | Numata et al. | |
| 6,400,606 B1 * | 6/2002 | Cho ........................ | G11C 16/28 365/185.2 |

(Continued)

*Primary Examiner* — Douglas King
(74) *Attorney, Agent, or Firm* — Harness, Dickey & Pierce, P.L.C.

(57) ABSTRACT

A resistive memory device according to an example embodiment of the inventive concepts includes: a cell array including a first section and a second section; a first column switch circuit connected to a memory cell and a reference cell of the first section through first bit lines; a second column switch circuit connected to a memory cell and a reference cell of the second section through second bit lines; and a column decoder configured to control the first and second column switch circuits such that one of the first bit lines connected to the memory cell and one of the second bit lines connected to the reference cell are selected according to a first column address, and one of the first bit lines connected to the reference cell and one of the second bit lines connected to the memory cell are selected according to a second column address.

9 Claims, 14 Drawing Sheets

(51) Int. Cl.
  *G11C 7/06* (2006.01)
  *G11C 7/08* (2006.01)
  *G11C 11/15* (2006.01)
  *G11C 11/16* (2006.01)

(52) U.S. Cl.
  CPC .. *G11C 13/0061* (2013.01); *G11C 2013/0045* (2013.01); *G11C 2013/0054* (2013.01)

(56) References Cited

U.S. PATENT DOCUMENTS

| | | |
|---|---|---|
| 6,912,152 B2 | 6/2005 | Iwata et al. |
| 7,385,866 B2 | 6/2008 | Lin et al. |
| 8,537,606 B2 | 9/2013 | Kim et al. |
| 9,153,307 B2 | 10/2015 | Kim et al. |
| 9,230,631 B2 | 1/2016 | Romanovskyy |
| 9,672,886 B2 | 6/2017 | Wang et al. |
| 9,685,228 B2 | 6/2017 | Wang et al. |
| 2004/0151015 A1 | 8/2004 | Do |
| 2006/0077737 A1 | 4/2006 | Ooishi |
| 2012/0069629 A1 | 3/2012 | Ueda et al. |
| 2012/0250400 A1 | 10/2012 | Katayama |
| 2014/0241041 A1 | 8/2014 | Lee |
| 2016/0035402 A1 | 2/2016 | Antonyan |
| 2017/0062032 A1 | 3/2017 | Seo et al. |
| 2020/0312396 A1* | 10/2020 | Pyo ...................... G11C 11/161 |

\* cited by examiner

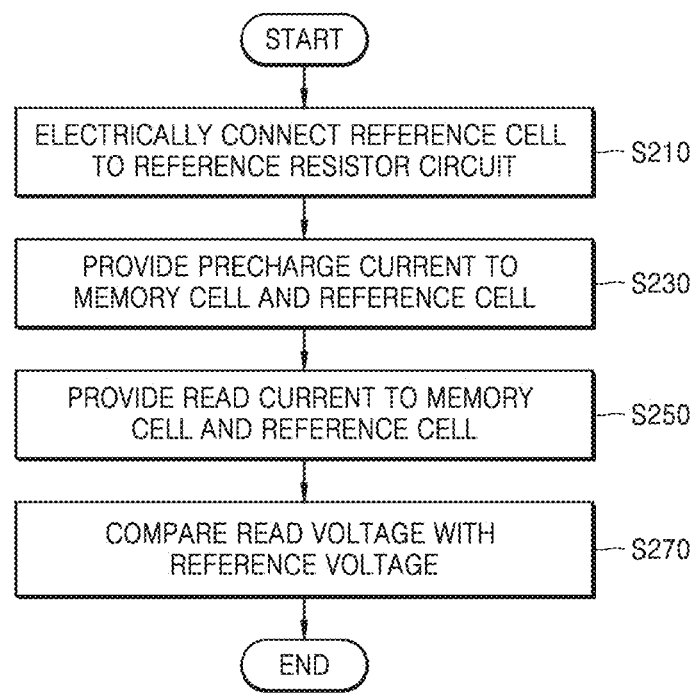

RESISTIVE MEMORY DEVICE INCLUDING REFERENCE CELL AND OPERATING METHOD THEREOF

CROSS-REFERENCE TO RELATED APPLICATION

This application is a divisional of U.S. application Ser. No. 16/131,575, filed Sep. 14, 2018; which claims priority under 35 U.S.C. § 119 to Korean Patent Applications No. 10-2017-0121877, filed on Sep. 21, 2017 and No. 10-2018-0020016, filed on Feb. 20, 2018, in the Korean Intellectual Property Office, the entire contents of each of which are incorporated herein by reference.

BACKGROUND

The inventive concepts relate to resistive memory devices, and more particularly, to resistive memory devices including a reference cell and/or methods of operating a resistive memory device.

A resistive memory device may store data in a memory cell that includes a variable resistance element. In order to detect data stored in the memory cell of the resistive memory device, for example, a read current may be supplied to the memory cell, and the read current and a voltage of the variable resistance element of the memory cell may be detected.

A resistance on a path through which the read current flows may hinder accurate reading of a value stored in the memory cell. Also, capacitance, for example, parasitic capacitance, on the path through which the read current flows may limit a reading speed of the value stored in the memory cell.

SUMMARY

The inventive concepts provides resistive memory devices, and more particularly, resistive memory devices capable of reading a value stored in a memory cell accurately at high speed and/or a method of operating the resistive memory device.

According to an example embodiment, a resistive memory device may include: a cell array including a first section and a second section, each including a memory cell and a reference cell sharing a word line activated according to a row address; a first column switch circuit connected to the memory cell and the reference cell of the first section through first bit lines; a second column switch circuit connected to the memory cell and the reference cell of the second section through second bit lines; and a column decoder configured to control the first and second column switch circuits such that one of the first bit lines connected to the memory cell and one of the second bit lines connected to the reference cell are selected according to a first column address, and one of the first bit lines connected to the reference cell and one of the second bit lines connected to the memory cell are selected according to a second column address.

According to an example embodiment, a resistive memory device may be configured to output a value stored in a memory cell in response to a read command, the resistive memory device may include: a cell array including a memory cell and a reference cell; a reference resistor circuit configured to be electrically connected to the reference cell during a read operation; a current source circuit configured to provide currents to the memory cell, the reference cell, and the reference resistor circuit according to a read control signal; and a control circuit configured to generate the read control signal such that a pumping current is provided to the reference resistor circuit in an initial period of the read operation.

According to an example embodiment, a method of operating a resistive memory device including a memory cell, a reference cell, and a reference resistor circuit may include: electrically connecting the reference cell to the reference resistor circuit in response to a read command; providing precharge currents to the memory cell and the reference cell, respectively, and providing a pumping current to the reference resistor circuit; providing read currents to the memory cell and the reference cell, respectively, and interrupting the pumping current; and comparing voltages according to the read currents to produce a comparison signal.

BRIEF DESCRIPTION OF THE DRAWINGS

Example embodiments of the inventive concepts will be more clearly understood from the following detailed description taken in conjunction with the accompanying drawings in which:

FIG. 11 is a flowchart illustrating a method of operating a memory device, according to an example embodiment of the inventive concepts;

DETAILED DESCRIPTION

Figure 1:
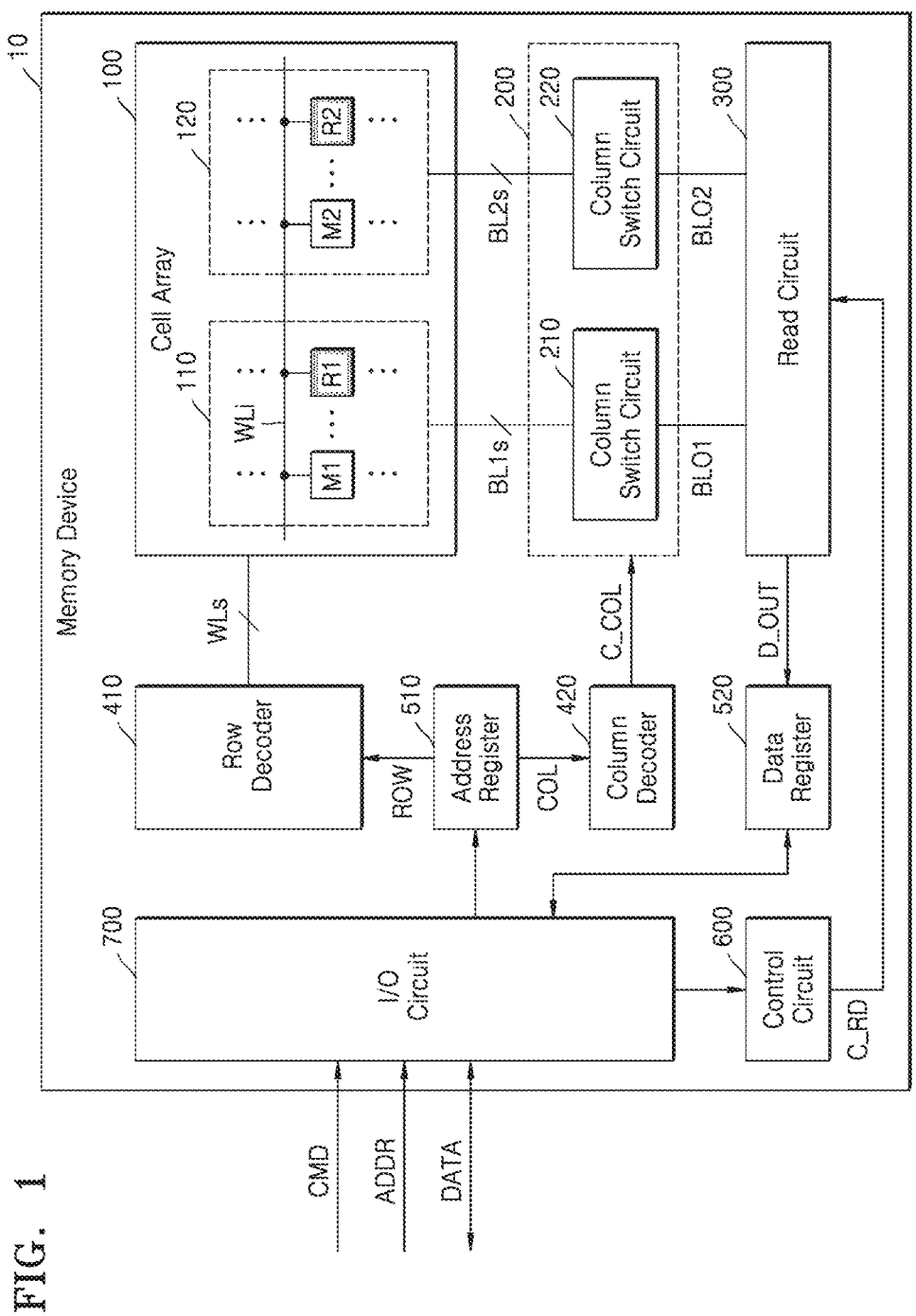
FIG. 1 is a block diagram of a memory device according to an example embodiment of the inventive concepts.

FIG. 1 is a block diagram of a memory device 10 according to an example embodiment of the inventive concepts. Referring to FIG. 1, the memory device 10 may receive and transmit various signals, for example, a command CMD and an address ADDR, and may receive or transmit data DATA. For example, the memory device 10 may receive the command CMD, for example, a write command, a read command, and the like, and the address ADDR corresponding to the command CMD from a memory controller. In addition, the memory device 10 may receive data DATA (i.e., write data) from the memory controller or provide data DATA (i.e., read data) to the memory controller. Although FIG. 1 separately shows the command CMD, the address ADDR, and the data DATA, in some example embodiments, at least two of the command CMD, the address ADDR, and the data DATA may be transmitted through an identical channel. As shown in FIG. 1, the memory device 10 may include a cell array 100, a column switch block 200, a read circuit 300, a row decoder 410, a column decoder 420, an address register 510, a data register 520, a control circuit 600, and/or an input/output circuit 700.

Figure 2:
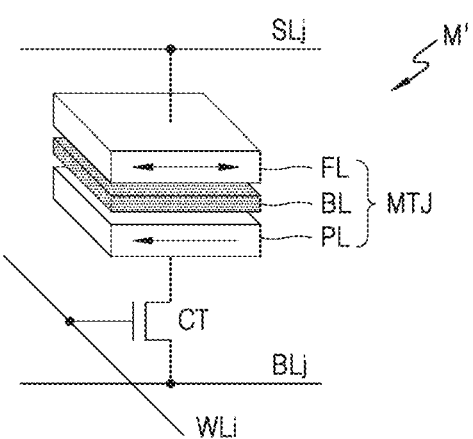
FIG. 2 is a view illustrating a memory cell included in a cell array of FIG. 1 according to an example embodiment of the inventive concepts.

The cell array 100 may include a plurality of memory cells M1 and M2. The memory cells M1 and M2 may include a variable resistance element (e.g., a magnetic tunnel junction (MTJ) element as shown in FIG. 2) and the variable resistance element may have a resistance corresponding to a value stored in the memory cells M1 and M2. Accordingly, the memory device 10 may be referred to as a resistive memory device, or a resistive random access memory (RRAM or ReRAM) device. For example, the memory device 10 may include, but is not limited to, the cell array 100 being implemented as, for example, phase change random access memory (PRAM), ferroelectric random access memory (FRAM), or the like, and thus, may include the cell array 100 having magnetic random access memory (MRAM) structure, for example, spin-transfer torque magnetic random access memory (STT-MRAM), spin torque transfer magnetization switching RAM (Spin-RAM), and/or spin momentum transfer RAM (SMT-RAM). As described below with reference to FIG. 2, example embodiments of the present disclosure will be described mainly with reference to MRAM, but the inventive concepts are not limited thereto.

The cell array 100 may include reference cells R1 and R2 used to determine values stored in the memory cells M1 and M2. For example, as shown in FIG. 1, the cell array 100 may include a first section 110 and a second section 120 having the same or symmetrical structure with respect to each other. The first section 110 and the second section 120 may share a plurality of word lines WLs activated by the row decoder 410 according to a row address ROW and may include, for example, a first memory cell M1 and a first reference cell R1 connected to a word line WLi. The second section 120 may include a second memory cell M2 and a second reference cell R2 connected to the word line WLi. Thus, the memory cells M1 and M2 and the reference cells R1 and R2 commonly connected to the word line WLi may be simultaneously selected by the activated word line WLi. Although only one word line WLi is shown in FIG. 1, the first section 110 and the second section 120 may share a plurality of word lines WLs. In addition, each of the first section 110 and the second section 120 may include a plurality of memory cells connected to the word lines WLi. In some example embodiments, as described later below with reference to FIGS. 3A and 3B, the reference cells R1 and R2 may be shorted cells not including a resistance element, for example, a variable resistance element.

The column switch block 200 may be connected to the cell array 100 through the plurality of bit lines BL1s and BL2s and may electrically connect at least one of the plurality of bit lines BL1s and BL2s to the read circuit 300 according to a column control signal C_COL provided from the column decoder 420. For example, as shown in FIG. 1, the column switch block 200 may include a first column switch circuit 210 and a second column switch circuit 220 having the same or symmetrical structure with respect to each other. The first column switch circuit 210 may be connected to the memory cells and reference cells included in the first section 110 of the cell array 100 through the first bit lines BL1s and may electrically connect one of the plurality of first bit lines BL1s to a first output bit line BLO1 connected to the read circuit 300 according to the column control signal C_COL. Also, the second column switch circuit 220 may be connected to the memory cells and reference cells included in the second section 120 of the cell array 100 through the second bit lines BL2s and may electrically connect one of the plurality of second bit lines BL2s to a second output bit line BLO2 connected to the read circuit 300 according to the column control signal C_COL. In some example embodiments, as described later below, the column switch block 200 may be controlled by the column decoder 420 so that a reference cell included in a section different from a memory cell to be read is selected. In the present specification, the fact that the first and second column switch circuits 210 and 220 electrically connect one of a plurality of bit lines to the read circuit 300 may be referred to as selecting one of the plurality of bit lines.

The read circuit 300 may supply current to the first output bit line BLO1 and the second output bit line BLO2 according to a read control signal C_RD provided from the control circuit 600, and may provide output data D_OUT to the data register 520 based on voltages of the first output bit line BLO1 and the second output bit line BLO2. Although FIG. 1 shows the read circuit 300 only, the memory device 10 may further include a write circuit connected to the first output bit line BLO1 and the second output bit line BLO2, and may further include a write/read circuit in which the write circuit and the read circuit 300 are implemented as one block.

The row decoder 410 may activate at least one of the plurality of word lines WLs according to the row address ROW provided from the address register 510. Memory cells connected to the activated word line (e.g., WLi) may be referred to as a page. As described above, the plurality of word lines WLs may be shared by the first section 110 and the second section 120 of the cell array 100.

The column decoder 420 may generate the column control signal C_COL according to a column address COL provided from the address register 510. In some example embodiments, the column decoder 420 may generate the column control signal C_COL such that a reference cell included in a section different from a section of a memory cell selected according to the column address COL is selected. For example, the column decoder 420 may select one of the first bit lines BL1s connected to a memory cell (e.g., M1), according to a first column address, and may further select one of the second bit lines BL2s connected to a reference cell (e.g., R2). On the other hand, the column decoder 420 may select one of the first bit lines BL1s connected to a reference cell (e.g., R1) according to a second column address, and may select one of the second bit lines BL2s connected to a memory cell (e.g., M2). As a result, due to the same or symmetrical structures of the first column switch circuit 210 and the second column switch circuit 220, a resistance difference between a path through which a read current passes through a memory cell and a path through which a read current passes through a reference cell may be reduced and consequently a value stored in the memory cell may be accurately read.

The input/output circuit 700 may receive the command CMD, the address ADDR, and the data DATA from the outside of the memory device 10 and output the data DATA. In some example embodiments, the input/output circuit 700 may decode the command CMD and provide a result of the decoding to the control circuit 600. For example, when a write command is received, the input/output circuit 700 may provide a signal indicating a write operation to the control circuit 600. On the other hand, when a read command is received, the input/output circuit 700 may provide a signal indicating a read operation to the control circuit 600. In some example embodiments, the input/output circuit 700 may decode the address ADDR and provide a result of the decoding to the address register 510. The address register 510 may store a row address and a column address according to a signal provided from the input/output circuit 700 and may provide the row decoder 410 and the column decoder 420 with the row address ROW and the column address COL, respectively. In some example embodiments, the input/output circuit 700 may provide data DATA received from the outside (for example, a memory controller) to the data register 520 or may externally output the output data D_OUT stored in the data register 520 as the data DATA.

The control circuit 600 may generate the read control signal C_RD when the signal provided from the input/output circuit 700 indicates a read command. In some example embodiments, the control circuit 600 may control the read circuit 300 to provide a read current to the first output bit line BLO1 and the second output bit line BLO2 through the read control signal C_RD. In some example embodiments, as described later below with reference to FIGS. 6 and 7, the control circuit 600 may control the read circuit 300 to provide precharge currents to the first output bit line BLO1 and the second output bit line BLO2 in an initial period of a read operation, and a value stored in a memory cell may be read out at high speed.

FIG. 2 is a view illustrating a memory cell included in the cell array 100 of FIG. 1 according to an example embodiment of the inventive concepts. In more detail, FIG. 2 shows a memory cell M' including MTJ as a variable resistance element.

As shown in FIG. 2, the memory cell M' may include the variable resistance element MTJ and the cell transistor CT connected in series between a source line SLj and a bit line BLj. In some example embodiments, the variable resistance element MTJ and the cell transistor CT may be connected in this order between the source line SLj and the bit line BLj as shown in FIG. 2, and in some example embodiments, the cell transistor CT and the variable resistance element MTJ may be connected in this order between the source line SLj and the bit line BLj unlike that shown in FIG. 2.

The variable resistance element MTJ may include a free layer FL and a pinned layer PL and may further include a barrier layer BL between the free layer FL and the pinned layer PL. As indicated by arrows in FIG. 2, a magnetization direction of the pinned layer PL may be fixed, while the free layer FL may have the same or opposite magnetization direction as the magnetization direction of the pinned layer PL. The variable resistance element MTJ may be referred to as being in a parallel state P when the pinned layer PL and the free layer FL have the same magnetization direction. However, the variable resistance element MTJ may be referred to as being in an anti-parallel state AP when the pinned layer PL and the free layer FL have magnetization directions opposite to each other. In some example embodiments, the variable resistance element MTJ may further include an anti-ferromagnetic layer such that the pinned layer PL has a fixed magnetization direction.

The variable resistance element MTJ may have a relatively low resistance $R_P$ in the parallel state P and a relatively high resistance $R_{AP}$ in the anti-parallel state AP. According to some example embodiments, when the variable resistance element MTJ in the parallel state P has the low resistance $R_P$, the memory cell M' stores "0", and when the variable resistance element MTJ in the anti-parallel state AP has the high resistance $R_{AP}$, the memory cell M' stores "1". Furthermore, according to some example embodiments, the resistance $R_P$ corresponding to "0" may be referred to as a parallel resistance $R_P$, and the resistance $R_{AP}$ corresponding to "1" may be referred to as an anti-parallel resistance $R_{AP}$.

The cell transistor CT may have a gate connected to the word line WLi, and a source and a drain connected to the bit line BLj and the variable resistance element MTJ. The cell transistor CT may electrically connect or disconnect the variable resistance element MTJ and the bit line BLj according to a signal applied to the word line WLi. For example, in order to write "0" in the memory cell M' in a write operation, the cell transistor CT may be turned on and a current from the source line SLj to the bit line BLj may pass through the variable resistance element MTJ and the cell transistor CT. Further, in order to write "1" in the memory cell M', the cell transistor CT may be turned on and a current from the bit line BLj to the source line SLj may pass through the cell transistor CT and the variable resistance element MTJ. In the read operation, the cell transistor CT may be turned on and the current from the source line SLj to the bit line BLj or the current from the bit line BLj to the source line SLj, that is, a read current may pass through the cell transistor CT and the variable resistance element MTJ. According to some example embodiments, the read current flows from the bit line BLj to the source line SLj.

Figure 3A:
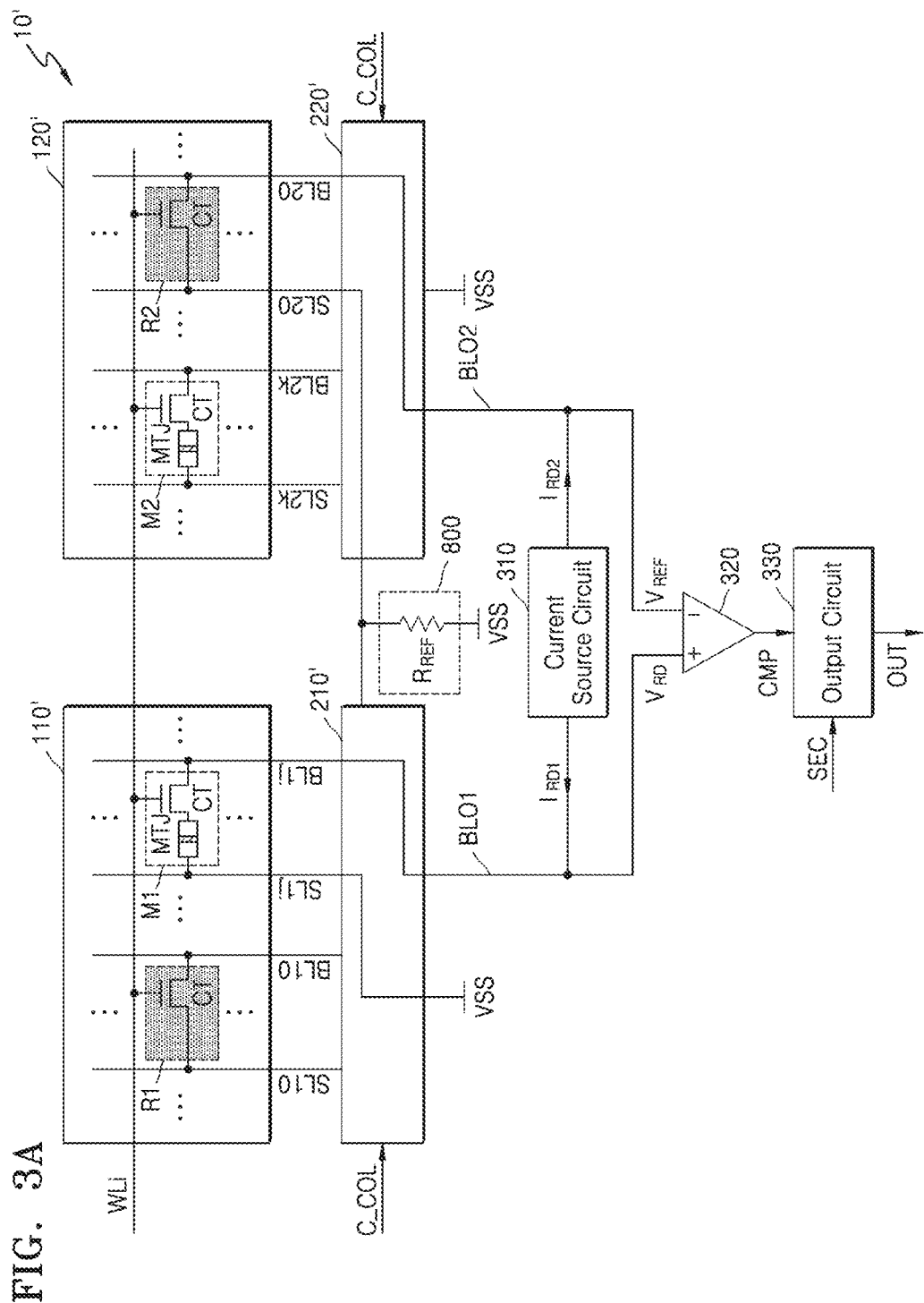
FIGS. 3A and 3B are block diagrams illustrating examples of the memory device of FIG. 1 for performing a read operation according to an example embodiment of the inventive concepts.
Figure 3B:
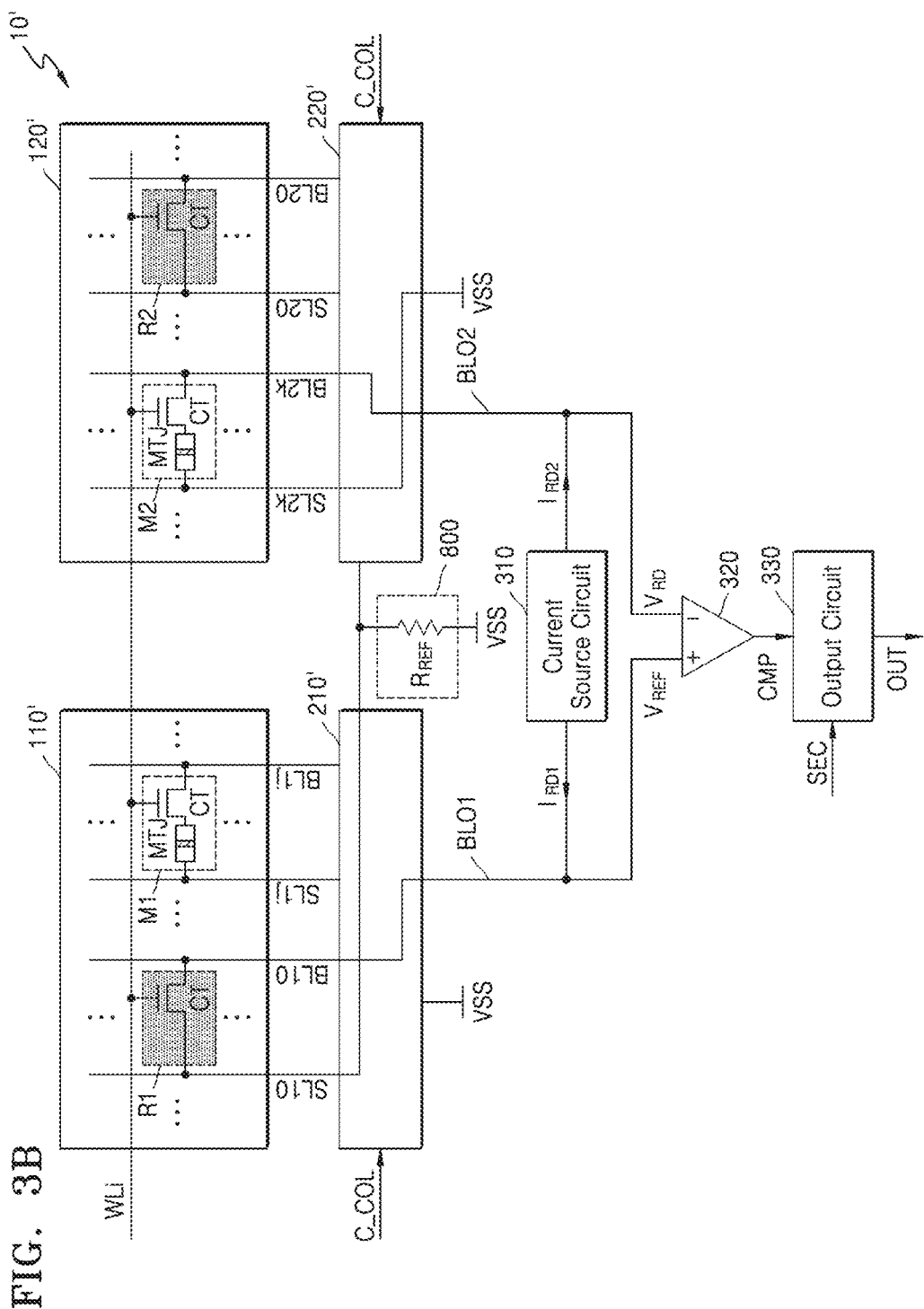

FIGS. 3A and 3B are block diagrams illustrating examples of the memory device 10 of FIG. 1 for performing a read operation according to an example embodiment of the inventive concepts. In more detail, FIG. 3A shows an example of reading the first memory cell M1 included in a first section 110' and FIG. 3B shows an example of reading the second memory cell M2 included in a second section 120'. As shown in FIGS. 3A and 3B, a memory device 10' may include a first section 110', a second section 120', a first column switch circuit 210', a second column switch circuit 220', a current source circuit 310, a sense amplifier 320, an output circuit 330, and/or a reference resistor circuit 800. As described above with reference to FIG. 1, the first section 110' and the second section 120' may be included in the cell array 100 of FIG. 1, and the first column switch circuit 210' and the second column switch circuit 220' may be included in the column switch block 200 of FIG. 1. The current source circuit 310, the sense amplifier 320, and the output circuit 330 of FIG. 3A may be included in the read circuit 300 of FIG. 1. Hereinafter, the same reference numerals as in FIGS. 3A and 3B denote the same elements, and therefore, detailed descriptions thereof will not be given herein.

Referring to FIG. 3A, in some example embodiments, to read the first memory cell M1 of the first section 110', the first column switch circuit 210' may select a bit line BL1j and a source line SL1j connected to the first memory cell M1 according to the column control signal C_COL. The first column switch circuit 210' may provide a negative supply voltage VSS to the source line SL1j connected to the first memory cell M1, and may electrically connect the bit line BL1$j$ connected to the first memory cell M1 to the first output bit line BLO1. Furthermore, in order to select the second reference cell R2 of the second section 120', the second column switch circuit 220' may select a bit line BL20 and a source line SL20 connected to the second reference cell R2 according to the column control signal C_COL. The second column switch circuit 220' may electrically connect the source line SL20, connected to the second reference cell R2, to the reference resistor circuit 800, and may electrically connect the bit line BL20 connected to the second reference cell R2 to the second output bit line BLO2.

The current source circuit 310 may provide a first read current $I_{RD1}$ to the first output bit line BLO1 and a second read current $I_{RD2}$ to the second output bit line BLO2. In some example embodiments, the first read current $I_{RD1}$ and the second read current $I_{RD2}$ may have identical magnitude. Accordingly, the first read current $I_{RD1}$ may flow through the first output bit line BLO1, the first column switch circuit 210', the bit line BL1$j$, the first memory cell M1, the source line SL1$j$, and the first column switch circuit 210' to the negative supply voltage VSS. The second read current $I_{RD2}$ may flow through the second output bit line BLO2, the second column switch circuit 220', the bit line BL20, the second reference cell R2, the source line SL20, the second column switch circuit 220', and the reference resistor circuit 800 to the negative supply voltage VSS. The reference resistor circuit 800 may provide a reference resistance $R_{REF}$, and the reference resistance $R_{REF}$ may coincide with, for example, "$(R_{AP}+R_P)/2$".

The sense amplifier 320 may generate a comparison signal CMP by comparing a voltage generated in the first output bit line BLO1 by the first read current $I_{RD1}$, that is, a read voltage $V_{RD}$ with a voltage generated in the second output bit line BLO2 by the second read current $I_{RD2}$, that is, a reference voltage $V_{REF}$. In FIGS. 3A and 3B, the first output bit line BLO1 and the second output bit line BLO2 are connected to a non-inverting input and an inverting input of the sense amplifier 320, respectively. However, in some example embodiments, connections may be opposite to those shown in FIGS. 3A and 3B.

The output circuit 330 may generate an output signal OUT from the comparison signal CMP according to a section selection signal SEC. As described later below with reference to FIG. 3B, when a memory cell included in the second section 120' is read, voltages applied to the non-inverting and inverting inputs of the sense amplifier 320 may be different from those shown in FIG. 3A. Thus, the output circuit 330 may generate the output signal OUT from the comparison signal CMP based on the section selection signal SEC, and the output signal OUT may indicate a value stored in the memory cell. The output circuit 330 will be described later below with reference to FIG. 4.

Referring to FIG. 3B, in some example embodiments, to read the second memory cell M2 of the second section 120', the second column switch circuit 220' may select a bit line BL2$k$ and a source line SL2$k$ connected to the second memory cell M2 according to the column control signal C_COL. The second column switch circuit 220' may provide the negative supply voltage VSS to the source line SL2$k$ connected to the second memory cell M2, and may electrically connect the bit line BL2$k$ connected to the second memory cell M2 to the second output bit line BLO2. Furthermore, in order to select the first reference cell R1 of the first section 110', the first column switch circuit 210' may select a bit line BL10 and a source line SL10 connected to the first reference cell R1 according to the column control signal C_COL. The first column switch circuit 210' may electrically connect the source line SL10 connected to the first reference cell R1 to the reference resistor circuit 800, and may electrically connect the bit line BL10 connected to the first reference cell R1 to the first output bit line BLO1.

The first read current $I_{RD1}$ provided by the current source circuit 310 may flow through the first output bit line BLO1, the first column switch circuit 210', the bit line BL10, the first reference cell R1, the source line SL10, the first column switch circuit 210', and the reference resistor circuit 800 to the negative supply voltage VSS. The second read current $I_{RD2}$ may flow through the second output bit line BLO2, the second column switch circuit 220', the bit line BL2$k$, the second memory cell M2, the source line SL2$k$, and the second column switch circuit 220' to the negative supply voltage VSS.

Compared with the FIG. 3A, the reference voltage $V_{REF}$ may be generated at the non-inverting input of the sense amplifier 320 and the read voltage $V_{RD}$ may be generated at the inverting input of the sense amplifier 320. Thus, although the first memory cell M1 of FIG. 3A and the second memory cell M2 of FIG. 3B store an identical value, the comparison signal CMP may indicate different values in examples of FIGS. 3A and 3B, respectively. In order to solve this problem, the output circuit 330 may generate the output signal OUT from the comparison signal CMP based on the section selection signal SEC, and the output signal OUT may indicate a value stored in a memory cell.

Figure 4:
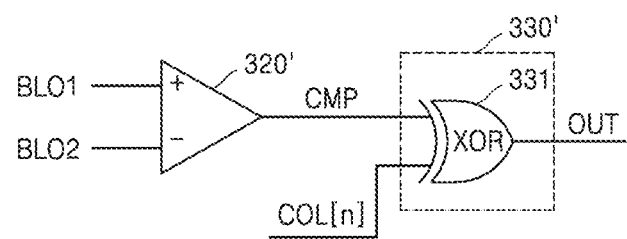
FIG. 4 is a block diagram illustrating an output circuit of FIGS. 3A and 3B according to an example embodiment of the inventive concepts.

FIG. 4 is a block diagram illustrating an output circuit 330 of FIGS. 3A and 3B according to an example embodiment of the inventive concepts. As described above with reference to FIGS. 3A and 3B, an output circuit 330' of FIG. 4 may generate an output signal OUT from the comparison signal CMP output by a sense amplifier 320'. As described above with reference to FIGS. 3A and 3B, the read voltage $V_{RD}$ may be generated at a non-inverting input of the sense amplifier 320' or at an inverting input of the sense amplifier 320'. Thus, the output circuit 330' may generate the output signal OUT, which is the same as the comparison signal CMP, when the first memory cell M1 of the first section 110' is selected, and may generate the output signal OUT obtained by inverting the comparison signal CMP when the second memory cell M2 of the second section 120' is selected. Hereinafter, FIG. 4 will be described with reference to FIGS. 3A and 3B.

As shown in FIG. 4, the output circuit 330' may include an XOR gate 331. The XOR gate 331 may receive an input receiving the comparison signal CMP from the sense amplifier 320' and $n^{th}$ bit (COL [n]) of the column address COL. That is, in FIG. 4, the section selection signal SEC of FIGS. 3A and 3B may be $n^{th}$ bit (COL [n]) of the column address COL. In some example embodiments, the $n^{th}$ bit (COL [n]) of the column address COL may be a most significant bit (MSB) of the column address COL. For example, each of the first section 110' and the second section 120' of FIGS. 3A and 3B may include 32 memory cells connected to an identical word line, and thus the number of memory cells connected to the identical word line may be 64. To indicate one of the 64 memory cells, a 6-bit column address (COL [6: 1]) may be received by the column decoder 420 of FIG. 1, and the column decoder 420 may provide an MSB of the 6-bit column address (COL [6: 1]), that is, sixth bit COL [6], to the output circuit 330' included in the read circuit 300 of FIG. 1 as the section selection signal SEC (i.e., n=6). For example, when the sixth bit (COL [6]) of the 6-bit column address (COL [6: 1]) is 0 (or low level), the 6-bit column address (COL [6: 1]) may indicate memory cells of the first section 110' and the XOR gate 331 may generate the same output signal OUT as the comparison signal CMP. On the other hand, when the sixth bit (COL [6]) of the 6-bit column address (COL [6: 1]) is 1 (or high level), the 6-bit column address (COL [6: 1]) may indicate memory cells of the second section 120' and the XOR gate 331 may generate the output signal OUT obtained by inverting the comparison signal CMP.

Figure 5:
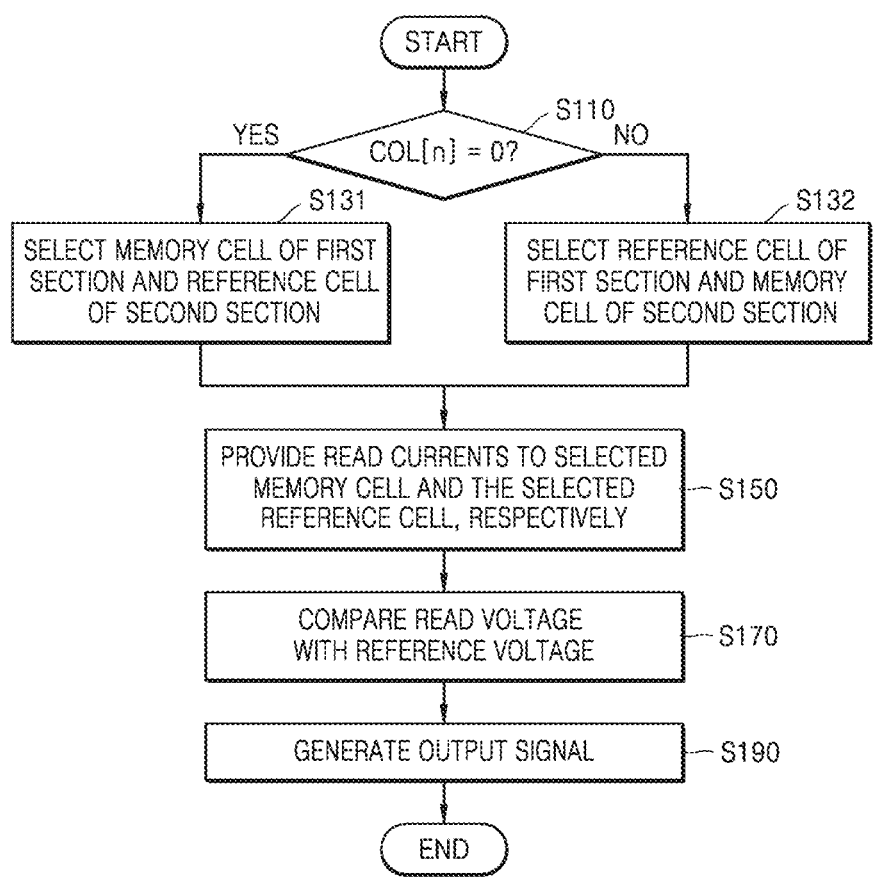
FIG. 5 is a flowchart illustrating a method of operating a memory device, according to an example embodiment of the inventive concepts.

FIG. 5 is a flowchart illustrating a method of operating a memory device, according to an example embodiment of the inventive concepts. In more detail, FIG. 5 shows a read operation of the memory device 10 of FIG. 1. In FIG. 5, memory cells of the first section 110 or memory cells of the second section 120 may be selected according to $n^{th}$ bit COL [n] of the column address COL. As shown in FIG. 5, the method of operating the memory device 10 may include a plurality of operations S110, S131, S132, S150, S170, and S190, and hereinafter, FIG. 5 will be described with reference to FIG. 1.

In operation S110, whether the $n^{th}$ bit COL [n] of the column address COL is zero may be determined. When the $n^{th}$ bit COL [n] of the column address COL is zero, the memory cells of the first section 110 may be selected, and operation S131 may be performed subsequently. On the other hand, when the $n^{th}$ bit COL [n] of the column address COL is not zero, the memory cells of the second section 120 may be selected, and operation S132 may be performed subsequently.

In operation S131, a memory cell of the first section 110 and a reference cell of the second section 120 may be selected. For example, the column decoder 420 may control the first column switch circuit 210 to select a first bit line connected to the first memory cell M1 of the first section 110 from among the first bit lines BL1s through the column control signal C_COL. Furthermore, the column decoder 420 may control the second column switch circuit 220 to select a second bit line connected to the second reference cell R2 of the second section 120 from among the second bit lines BL2s through the column control signal C_COL. The selected first bit line and the selected second bit line may be electrically connected to the read circuit 300.

In operation S132, a reference cell of the first section 110 and a memory cell of the second section 120 may be selected. For example, the column decoder 420 may control the first column switch circuit 210 to select a first bit line connected to the first reference cell R1 of the first section 110 from among the first bit lines BL1s through the column control signal C_COL. Furthermore, the column decoder 420 may control the second column switch circuit 220 to select a second bit line connected to the second memory cell M2 of the second section 120 from among the second bit lines BL2s through the column control signal C_COL. The selected first bit line and the selected second bit line may be electrically connected to the read circuit 300.

In operation S150, read currents may be provided to the selected memory cell and the selected reference cell, respectively. For example, as described above with reference to FIGS. 3A and 3B, the read circuit 300 may include the current source circuit 310, and the current source circuit 310 may provide read currents of identical magnitude to the selected memory cell and the selected reference cell, respectively. In operation S131 and operation S132, since the memory cell and the reference cell are respectively selected in different sections, a resistance difference between paths through which the read currents provided to the memory cell and the reference cell pass may be reduced, so that a value stored in the memory cell may be accurately read.

In operation S170, the reference voltage $V_{REF}$ and the read voltage $V_{RD}$ may be compared with each other. As described above with reference to FIGS. 3A and 3B, the reference voltage $V_{REF}$ may refer to a voltage generated at an input of the sense amplifier 320 by providing a read current to the reference cell, and the read voltage $V_{RD}$ may be referred to as a voltage generated at the input of the sense amplifier 320 by providing a read current to the memory cell. The sense amplifier 320 may generate the comparison signal CMP by comparing the reference voltage $V_{REF}$ with the read voltage $V_{RD}$.

In operation S190, the output signal OUT may be generated. For example, the read circuit 300 of FIG. 1 may include the output circuit 330 of FIGS. 3A and 3B and the output circuit 330 may output the output signal OUT from the comparison signal CMP according to a section including the read memory cell. In some example embodiments, when the $n^{th}$ bit COL [n] of the column address COL is zero, the output signal OUT may be the same as the comparison signal CMP. However, when the $n^{th}$ bit COL [n] of the column address COL is not zero, the output signal OUT may be the same as a signal obtained by inverting the comparison signal CMP.

Figure 6:
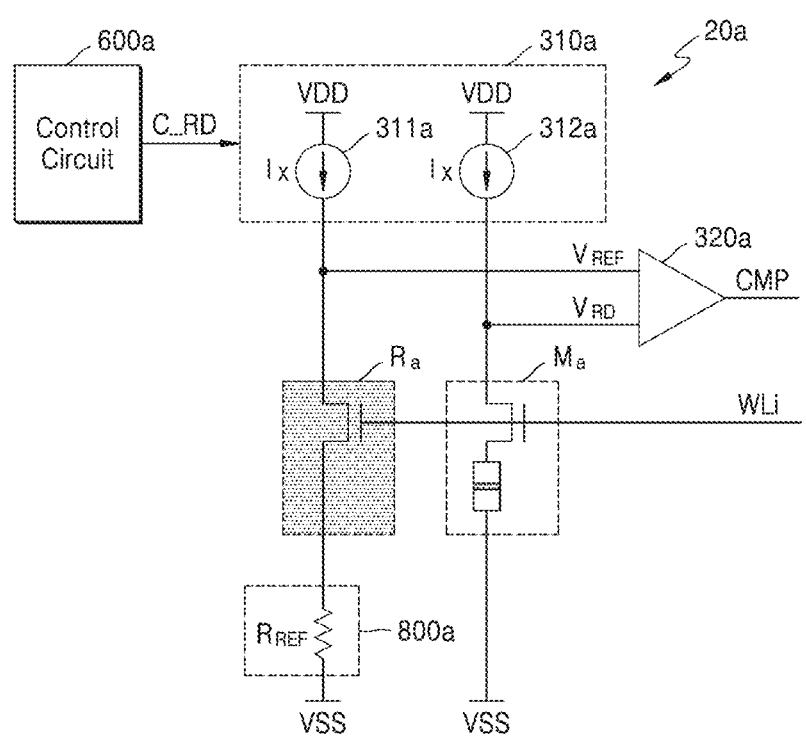
FIG. 6 is a block diagram of a memory device according to an example embodiment of the inventive concepts.
Figure 7:
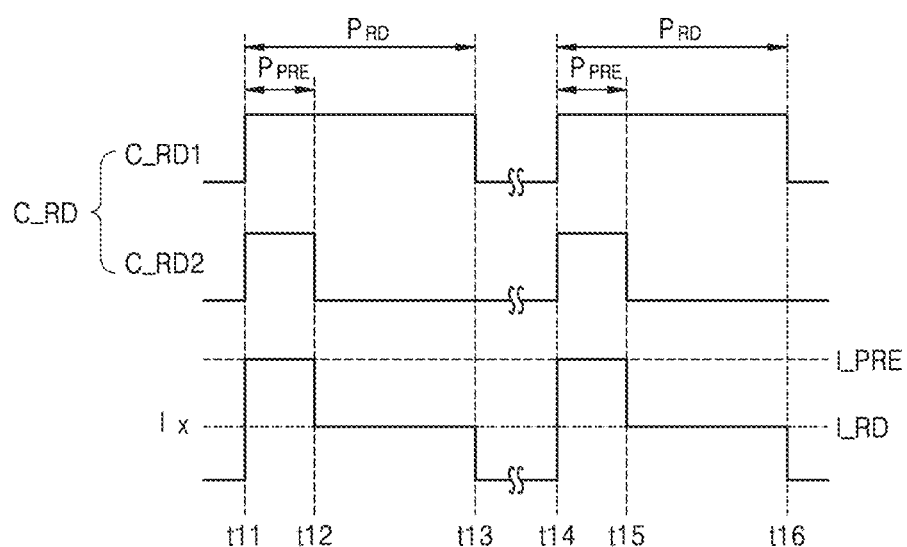
FIG. 7 is a timing diagram illustrating an operation of the memory device of FIG. 6 according to an example embodiment of the inventive concepts.

FIG. 6 is a block diagram of a memory device 20a according to an example embodiment of the inventive concepts, and FIG. 7 is a timing diagram illustrating an operation of the memory device 20a of FIG. 6 according to an example embodiment of the inventive concepts. In more detail, FIG. 6 is an equivalent circuit diagram schematically illustrating a structure of the memory device 20a during a read operation, and FIG. 7 shows the read control signal C_RD and a current $I_X$ over time.

Referring to FIG. 6, the memory device 20a may include a control circuit 600a, a current source circuit 310a, a sense amplifier 320a, a reference cell Ra, a memory cell Ma, and/or a reference resistor circuit 800a. The reference cell Ra and the memory cell Ma may be included in a cell array of the memory device 20a and may be connected to the same word line WLi. In some example embodiments, as described above with reference to FIGS. 3A and 3B, the reference cell Ra and the memory cell Ma may be included in different sections of the cell array, respectively, or may be included in an identical section. In some example embodiments, unlike those shown in FIG. 1, the memory device 20a may include one section, and the reference cell Ra and the memory cell Ma may be included in an identical section.

The control circuit 600a may control a current $I_X$ generated by the current source circuit 310a through the read control signal C_RD. The current source circuit 310a may include a first current source 311a and a second current source 312a. The first current source 311a and the second current source 312a may each generate a current $I_X$ of identical magnitude, and may have the same or symmetrical structure with each other in some example embodiments. As shown in FIG. 6, the current $I_X$ generated by the first current source 311a flows from a positive supply voltage VDD to a negative supply voltage VSS through the reference cell Ra and the reference resistor circuit 800a, and the current $I_X$ generated by the second current source 312a may flow from the positive supply voltage VDD to the negative supply voltage VSS through the memory cell Ma. The sense amplifier 320a may generate the comparison signal CMP by comparing the reference voltage $V_{REF}$ by the reference cell Ra and the reference resistor circuit 800a with the read voltage $V_{RD}$ by the memory cell Ma.

Referring to FIG. 7, in some example embodiments, the control circuit 600a may control the current source circuit 310a to generate a large current $I_X$ during an initial period of a read operation. For example, as shown in FIG. 7, a current $I_X$ may be generated by the current source circuit 310a from time t11 to time t13 in order to read the memory cell Ma from the memory device 20a, and a period from time t11 to time t13 may be referred to as a read period $P_{RD}$. Similarly, a read period $P_{RD}$ from time t14 to time t16 may follow to read another memory cell.

The current $I_X$ may have a size of "I_PRE" during the initial period of the read period $P_{RD}$ from time t11 to time t12, and may have a size of "I_RD" less than "I_PRE" from time t12 to time t13. The initial period of the read period $P_{RD}$, that is, the period from time t11 to time t12, may be referred to as a precharge period $P_{PRE}$, and the current $I_X$ provided to a memory cell and a reference cell during the precharge period $P_{PRE}$ may be referred to as a precharge current. Furthermore, a current $I_X$ of the "I_RD" size after the end of the precharge period $P_{PRE}$ may be referred to as a read current. As such, the current $I_X$ that is relatively large in the precharge period $P_{PRE}$, that is, a precharge current, may be provided to a memory cell and a reference cell, respectively, and capacitance (or parasitic capacitance) may be quickly charged. Accordingly, a time required for stabilizing the read voltage $V_{RD}$ and the reference voltage $V_{REF}$ may be shortened, and as a result, a time taken to read the memory cell Ma, that is, the read period $P_{RD}$, may be shortened. Similarly, in the read period $P_{RD}$ from time t14 to time t16 in order to read another memory cell, a precharge current may be provided to the memory cell and the reference cell during the precharge period $P_{PRE}$ from time t14 to time t15.

The control circuit 600a may generate the read control signal C_RD including a first read control signal C_RD1 and a second read control signal C_RD2 in order to control the current source circuit 310a according to the read period $P_{RD}$ and the precharge period $P_{PRE}$. As shown in FIG. 7, the first read control signal C_RD1 may be activated during the read period $P_{RD}$ and the second read control signal C_RD2 may be activated during the precharge period $P_{PRE}$. In some example embodiments, each of the first current source 311a and the second current source 312a in FIG. 6 may include a current source being activated according to the first read control signal C_RD1 and generating a current of "I_RD" size, and a current source being activated according to the second read control signal C_RD2 and generating a current of "I_REF-I_RD" size.

Figure 8:
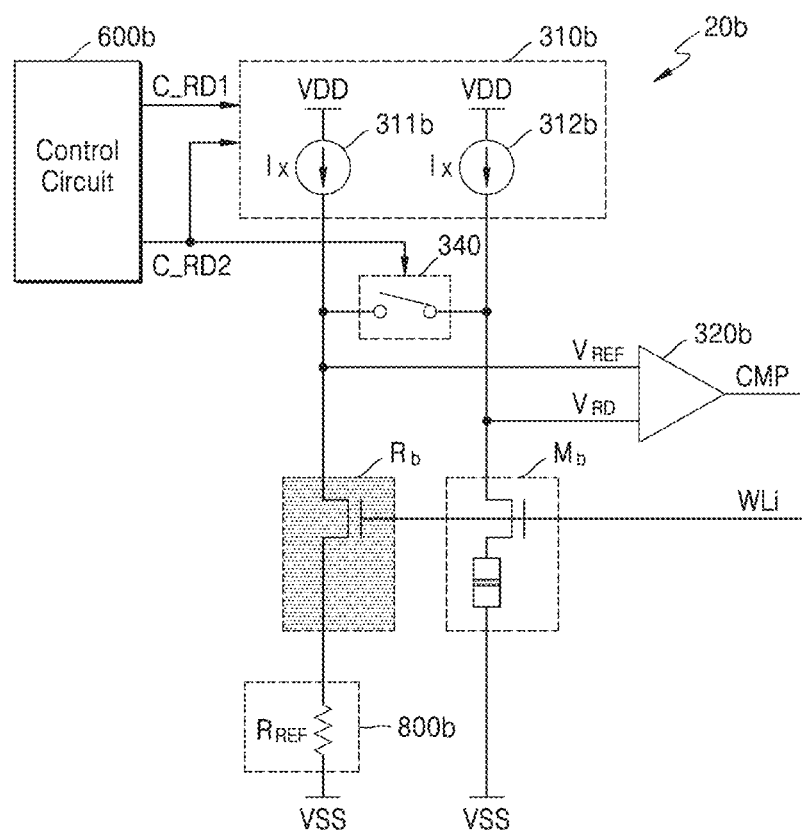
FIG. 8 is a block diagram of a memory device according to an example embodiment of the inventive concepts.

FIG. 8 is a block diagram of a memory device 20b according to an example embodiment of the inventive concepts. In more detail, FIG. 8 is an equivalent circuit diagram schematically showing a structure of the memory device 20b during a read operation. Compared to the memory device 20a of FIG. 6, the memory device 20b of FIG. 8 may further include an equalization switch 340. In FIG. 8, the same reference numerals as in FIGS. 6 and 7 denote the same elements, and therefore, detailed descriptions thereof will not be given herein.

Referring to FIG. 8, the memory device 20b may include a control circuit 600b, a current source circuit 310b, a sense amplifier 320b, a reference cell Rb, a memory cell Mb, and/or a reference resistor circuit 800b, and may further include an equalization switch 340. The reference cell Rb and the memory cell Mb may be connected to the same word line WLi and the current source circuit 310b may include a first current source 311b and a second current source 312b that respectively provide the current $I_X$ to the reference cell Rb and the memory cell Mb. The equalization switch 340 may electrically connect the reference cell Rb to the memory cell Mb according to the second read control signal C_RD2.

The control circuit 600b may generate the first read control signal C_RD1 and the second read control signal C_RD2, similar to that described above with reference to FIG. 7. The first read control signal C_RD1 may be activated during the read period $P_{RD}$, but the second read control signal C_RD2 may be activated during the precharge period $P_{PRE}$ at the beginning of the read period $P_{RD}$. Accordingly, the first current source 311b and the second current source 312b may provide a relatively large current $I_X$ during the precharge period $P_{PRE}$.

The equalization switch 340 may electrically connect the reference cell Rb to the memory cell Mb in response to the activated second read control signal C_RD2. That is, the reference cell Rb and the memory cell Mb may be electrically connected to each other during the precharge period $P_{PRE}$ by the equalization switch 340 and the reference voltage $V_{REF}$ and the read voltage $V_{RD}$ may have an identical size during precharge period $P_{PRE}$. The precharge period $P_{PRE}$ may have a difference depending on a value stored in the memory cell Mb in the future. Thus, a difference between precharging the reference cell Rb and precharging the memory cell Mb may be reduced during the precharge period $P_{PRE}$ and as a result the value stored in the memory cell Mb may be accurately determined.

Figure 9:
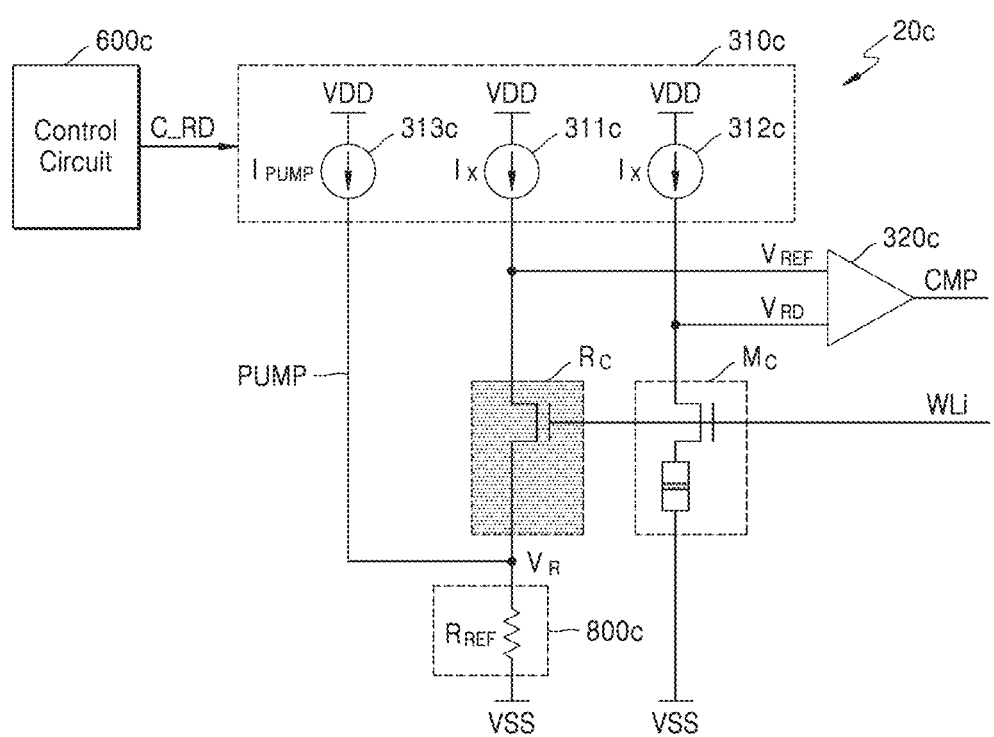
FIG. 9 is a block diagram of a memory device according to an example embodiment of the inventive concepts.
Figure 10:
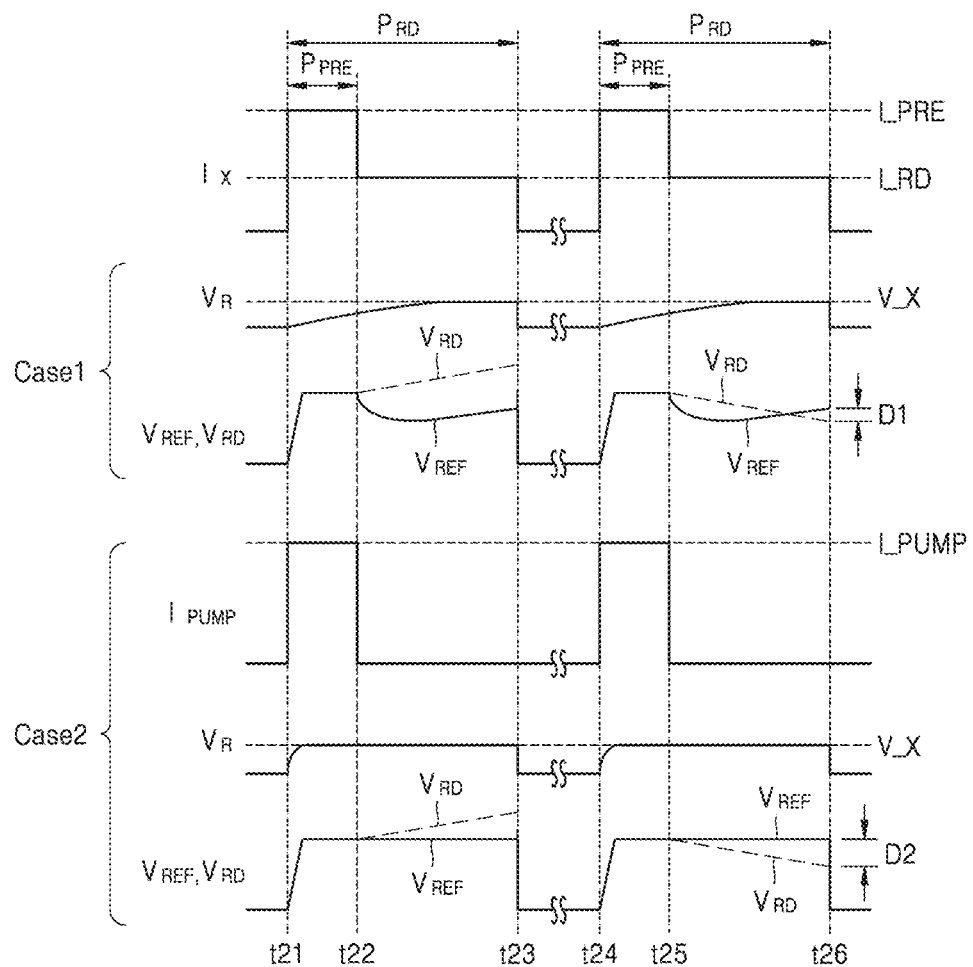
FIG. 10 is a timing diagram illustrating an operation of the memory device of FIG. 9 according to an example embodiment of the inventive concepts.

FIG. 9 is a block diagram of a memory device 20c according to an example embodiment of the inventive concepts, and FIG. 10 is a timing diagram illustrating an operation of the memory device 20c of FIG. 9 according to an example embodiment of the inventive concepts. In more detail, FIG. 9 is an equivalent circuit diagram schematically illustrating a structure of the memory device 20c during a read operation, and FIG. 10 shows currents $I_X$ and $I_{PUMP}$ and voltages $V_R$, $V_{REF}$, and $V_{RD}$ over time. Compared to the memory device 20a of FIG. 6, the memory device 20c of FIG. 9 may further include a path PUMP through which a pumping current $I_{PUMP}$ is supplied from a current source circuit 310c to a reference resistor circuit 800c. In FIG. 9, the same reference numerals as in FIGS. 6 and 7 denote the same elements, and therefore, detailed descriptions thereof will not be given herein.

Referring to FIG. 9, the memory device 20c may include a control circuit 600c, the current source circuit 310c, a sense amplifier 320c, a reference cell Rc, a memory cell Mc, and the reference resistor circuit 800c. The reference cell Rc and the memory cell Mc may be connected to the same word line WLi. The current source circuit 310c may include a first current source 311c and a second current source 312c that respectively provide the current $I_X$ to the reference cell Rc and the memory cell Mc, and may further include a third current source 313c that provides the pumping current $I_{PUMP}$ to the reference resistor circuit 800c. In some example embodiments, the memory device 20c may further include an equalization switch for electrically connecting the reference cell Rc to the memory cell Mc similarly to the memory device 20b of FIG. 8.

The reference resistor circuit 800c may be arranged outside a cell array of the memory device 20c. Thus, due to liberation from spatial structural limitation of the cell array, the reference resistor circuit 800c may provide the reference resistance $R_{REF}$ that is insensitive to process voltage temperature (PVT) fluctuation, while causing capacitance (or parasitic capacitance). The capacitance of the reference resistor circuit 800c may extend a time taken for precharging by the current $I_X$ generated by the first current source 311c and consequently a time taken to read the memory cell Mc may be prolonged.

As shown in FIG. 9, the current source circuit 310c may include the third current source 313c that generates the pumping current $I_{PUMP}$ according to the read control signal C_RD and the memory device 20c may include the path PUMP for supplying the pumping current $I_{PUMP}$ to the reference resistor circuit 800c. The pumping current $I_{PUMP}$ may be supplied to the reference resistor circuit 800c during an initial period of the read operation, for example, the precharge period $P_{PRE}$, so that capacitance caused by the reference resistor circuit 800c may be quickly charged.

Referring to FIG. 10, a memory cell storing "1" from time t21 to time t23, that is, a memory cell having the high resistance $R_{AP}$, may be read. In addition, a memory cell storing "0" from time t24 to time t26, that is, a memory cell having a low resistance $R_P$, may be read. Furthermore, case 1 of FIG. 10 shows an example in which the pumping current $I_{PUMP}$ is not provided to the reference resistor circuit 800c, but case 2 of FIG. 10 shows an example in which the pumping current $I_{PUMP}$ is provided to the reference resistor circuit 800c.

Referring to case 1 of FIG. 10, during the precharge period $P_{PRE}$ from time t21 to time t22, the voltage $V_R$ at one end of the reference resistor circuit 800c may slowly increase due to the capacitance of the reference resistor circuit 800c despite a current $I_X$ of "I_PRE" size. When the precharge period $P_{PRE}$ ends at time t22, the reference voltage $V_{REF}$ may be lowered due to an insufficiently charged parasitic capacitor of the reference resistor circuit 800c, but the read voltage $V_{RD}$ may gradually increase due to a current $I_X$ passing through a memory cell having a high resistance $R_{AP}$ and a capacitance on a path through which the current $I_X$ travels. At time t23, the read voltage $V_{RD}$ and the reference voltage $V_{REF}$ may be compared with each other by the sense amplifier 320c.

Similarly, during the precharge period $P_{PRE}$ from time t24 to time t25, a voltage $V_R$ at one end of the reference resistor circuit 800c may slowly increase. When the precharge period $P_{PRE}$ ends at time t25, the reference voltage $V_{REF}$ may be lowered due to an insufficiently charged parasitic capacitor of the reference resistor circuit 800c, but the read voltage $V_{RD}$ may be gradually lowered due to a current $I_X$ passing through a memory cell having the low resistance $R_P$ and a capacitance on a path through which the current $I_X$ travels. At time t26, the read voltage $V_{RD}$ and the reference voltage $V_{REF}$ may be compared with each other by the sense amplifier 320c. As shown in FIG. 10, a difference D1 between the read voltage $V_{RD}$ and the reference voltage $V_{REF}$ may be relatively less and therefore a value read from a memory cell may contain an error. The read voltage $V_{RD}$ is further lowered by delaying a time at which the read voltage $V_{RD}$ and the reference voltage $V_{REF}$ are compared with each other by the sense amplifier 320c such that the difference D1 between the read voltage $V_{RD}$ and the reference voltage $V_{REF}$ increases. Accordingly, the read period $P_{RD}$ may be extended.

Referring to case 2 of FIG. 10, during the precharge period $P_{PRE}$ from time t21 to time t22, the parasitic capacitor may be charged by the pumping current $I_{PUMP}$ of the "I_PUMP" size, and thus the voltage $V_R$ at one end of the reference resistor circuit 800c may quickly increase to "V_X". When the precharge period $P_{PRE}$ ends at time t22, the reference voltage $V_{REF}$ may be maintained due to a sufficiently charged parasitic capacitor of the reference resistor circuit 800c, but the read voltage $V_{RD}$ may gradually increase due to the current $I_X$ passing through the memory cell having the high resistance $R_{AP}$ and the capacitance on the path through which the current $I_X$ travels. At time t23, the read voltage $V_{RD}$ and the reference voltage $V_{REF}$ may be compared with each other by the sense amplifier 320c. In some example embodiments, the "I_PUMP" size of the pumping current $I_{PUMP}$ may be greater than the "I_PRE" size of a precharge current.

Similarly, during the precharge period $P_{PRE}$ from time t24 to time t25, a voltage $V_R$ at one end of the reference resistor circuit 800c may quickly increase to "V_X". When the precharge period $P_{PRE}$ ends at time t25, the reference voltage $V_{REF}$ may be maintained due to a sufficiently charged parasitic capacitor of the reference resistor circuit 800c, but the read voltage $V_{RD}$ may be gradually lowered due to a current $I_X$ passing through a memory cell having the low resistance $R_P$ and a capacitance on a path through which the current $I_X$ travels. At time t26, the read voltage $V_{RD}$ and the reference voltage $V_{REF}$ may be compared with each other by the sense amplifier 320c. As shown in FIG. 10, a difference D2 between the read voltage $V_{RD}$ and the reference voltage $V_{REF}$ may be relatively high and therefore a value stored in the memory cell may be accurately determined. Also, extension of the read period $P_{RD}$ may be prevented, and thus, the value stored in the memory cell may be quickly read.

FIG. 11 is a flowchart illustrating a method of operating a memory device, according to an example embodiment of the inventive concepts. In more detail, FIG. 11 shows a read operation of the memory device, and in some example embodiments, the method of FIG. 11 may be performed by, for example, the memory device 20a of FIG. 6. As shown in FIG. 11, the method of operating the memory device may include a plurality of operations S210, S230, S250 and S270, and hereinafter, FIG. 11 will be described with reference to FIGS. 6 and 7.

In operation S210, an operation of electrically connecting the reference cell Ra to the reference resistor circuit 800a may be performed. In some example embodiments, the column decoder may electrically connect a reference cell Ra included in a section different from that of a memory cell Ma to be read to the reference resistor circuit 800a, as described above with reference to FIGS. 3A and 3B. For example, the column decoder may generate a control signal (e.g., C_COL in FIGS. 3A and 3B) such that the reference cell Ra and the reference resistor circuit 800a are electrically connected to each other.

In operation S230, a precharge current may be provided to the memory cell Ma and the reference cell Ra. For example, the current source circuit 310a may provide a current $I_X$ of I_PRE size, that is, the precharge current, to the memory cell Ma and the reference cell Ra according to the read control signal C_RD. Thus, a capacitance (or parasitic capacitance) existing in a path through which the current $I_X$ passes may be quickly charged, and a time taken for stabilizing the read voltage $V_{RD}$ and the reference voltage $V_{REF}$ may be shortened. Examples of operation S230 will be described later below with reference to FIGS. 12A and 12B.

In operation S250, a read current may be provided to the memory cell Ma and the reference cell Ra. For example, the current source circuit 310a may provide the current $I_X$ of I_RD size, that is, the read current, to the memory cell Ma and the reference cell Ra according to the read control signal C_RD. Examples of operation S250 will be described later below with reference to FIGS. 12A and 12B.

In operation S270, the read voltage $V_{RD}$ and the reference voltage $V_{REF}$ may be compared with each other. For example, the sense amplifier 320a may generate the comparison signal CMP by comparing the read voltage $V_{RD}$ with the reference voltage $V_{REF}$ and the comparison signal CMP may represent a value stored in the memory cell Ma.

Figure 12A:
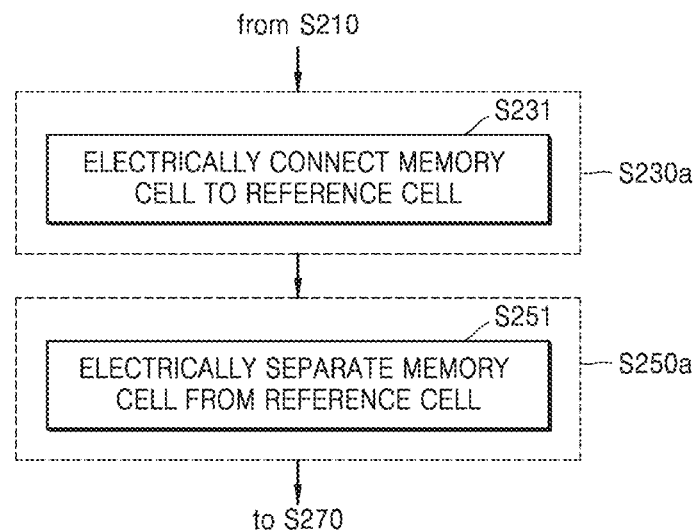
FIGS. 12A and 12B are flowcharts illustrating examples of operation S230 and operation S250 of FIG. 11 according to an example embodiment of the inventive concepts.
Figure 12B:
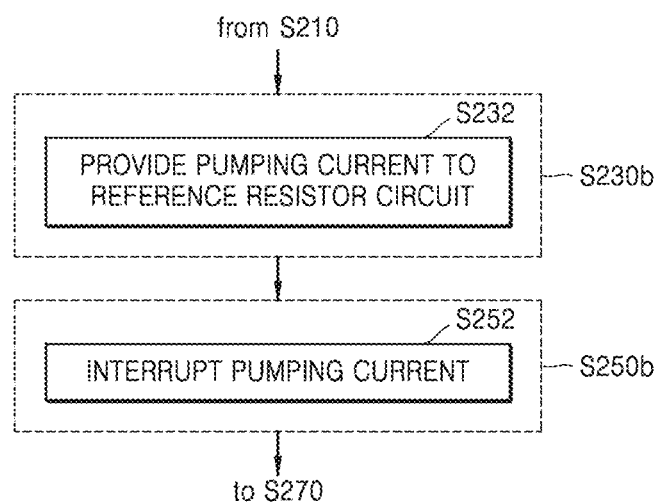

FIGS. 12A and 12B are flowcharts illustrating examples of operation S230 and operation S250 of FIG. 11 according to example embodiments of the inventive concepts. For example, operations S230a and S250a of FIG. 12A may be performed by the memory device 20b of FIG. 8, and operations S230b and S250b of FIG. 12B may be performed by the memory device 20c of FIG. 9. Hereinafter, FIGS. 12A and 12B will be described with reference to FIGS. 8, 9, and 10.

Referring to FIG. 12A, operation S230a may include operation S231, and operation S250a may include operation S251. In operation S231, an operation of electrically connecting the memory cell Mb to the reference cell Rb may be performed. For example, the memory device 20b of FIG. 8 may include the equalization switch 340 that is controlled by the second read control signal C_RD2. The equalization switch 340 may electrically connect the memory cell Mb to the reference cell Rb in response to the second read control signal C_RD2 activated during the precharge period $P_{PRE}$. Thus, a difference between precharging the reference cell Rb and precharging the memory cell Mb may be reduced during the precharge period $P_{PRE}$.

In operation S251, an operation of electrically separating the memory cell Mb from the reference cell Rb may be performed. For example, the equalization switch 340 may electrically separate the memory cell Mb from the reference cell Rb in response to a deactivated second read control signal C_RD2. Thus, the read voltage $V_{RD}$ and the reference voltage $V_{REF}$ may have a difference according to a value stored in the memory cell Mb after the precharge period $P_{PRE}$, and the value stored in the memory cell Mb may be determined accurately.

Referring to FIG. 12B, operation S230b may include operation S232, and operation S250b may include operation S252. In operation S232, an operation of providing the pumping current $I_{PUMP}$ to the reference resistor circuit 800c may be performed. For example, the current source circuit 310c in the memory device 20c of FIG. 9 may include the third current source 313c that generates the pumping current $I_{PUMP}$ according to the read control signal C_RD. The third current source 313c may provide the pumping current $I_{PUMP}$ to the reference resistor circuit 800c through the path PUMP during the precharge period $P_{PRE}$. As a result, a parasitic capacitor caused by the reference resistor circuit 800c may be charged quickly during the precharge period $P_{PRE}$.

In operation S252, an operation of interrupting the pumping current $I_{PUMP}$ may be performed. For example, the third current source 313c of the current source circuit 310c may stop providing the pumping current $I_{PUMP}$ according to the read control signal C_RD when the precharge period $P_{PRE}$ ends. Therefore, the reference voltage $V_{REF}$ may be maintained due to a sufficiently charged parasitic capacitor of the reference resistor circuit 800c and the read voltage $V_{RD}$ and the reference voltage $V_{REF}$ may have an enough difference to detect at the end of the read period $P_{RD}$.

Figure 13:
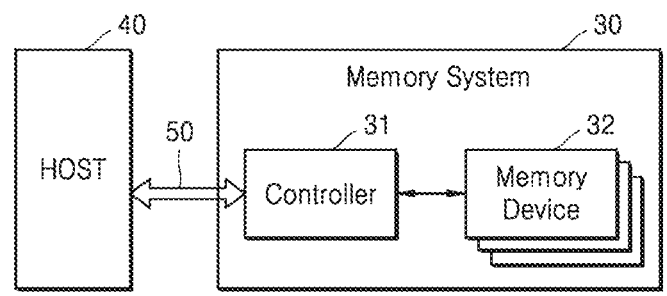
FIG. 13 is a block diagram of a memory system including a memory device according to an example embodiment of the inventive concepts.

FIG. 13 is a block diagram of a memory system 30 including a memory device according to an example embodiment of the inventive concepts. As shown in FIG. 13, the memory system 30 may be in communication with a host 40 and may include a controller 31 and a memory device 32.

An interface 50 through which the memory system 30 and the host 40 communicate with each other may use an electrical and/or optical signal, and may implemented by, but is not limited to, a serial advanced technology attachment (SATA) interface, an SATA express (SATAe) interface, a serial attached small computer system interface (serial attached SCSI; SAS), a peripheral component interconnect express (PCIe) interface, a nonvolatile memory-express (NVMe) interface, an advanced host controller interface (AHCI), or a combination thereof.

In some example embodiments, the memory system 30 may communicate with the host 40 by being removably coupled to the host 40. The memory device 32 may be a nonvolatile memory as a resistive memory, and the memory system 30 may be referred to as a storage system. For example, the memory system 30 may be implemented by, but is not limited to, a solid-state drive or solid-state disk (SSD), an embedded SSD (eSSD), a multimedia card (MMC), an embedded multimedia card (eMMC), and the like.

The controller 31 may control the memory device 32 in response to a request received from the host 40 through the interface 50. For example, the controller 31 may write data received in response to a write request to the memory device 32, and may provide the host 40 with data stored in the memory device 32 in response to a read request.

The memory system 30 may include at least one memory device 32 and the memory device 32 may include a memory cell having a variable resistance element and a reference cell. As described above, in some example embodiments, a resistance difference between paths through which read currents provided to the memory cell and the reference cell pass may be reduced in an operation of reading the memory cell included in the memory device 32, so that a value stored in the memory cell may be accurately read. Also, in some example embodiments, the value stored in the memory cell may be read at high speed because a precharge current is provided at the beginning of a read operation. Furthermore, in some example embodiments, a capacitance due to a reference resistor circuit may be compensated, and thus a sensing margin for reading the value stored in the memory cell may be improved. As a result, an operating speed and operational reliability of the memory system 30 may be improved.

Figure 14:
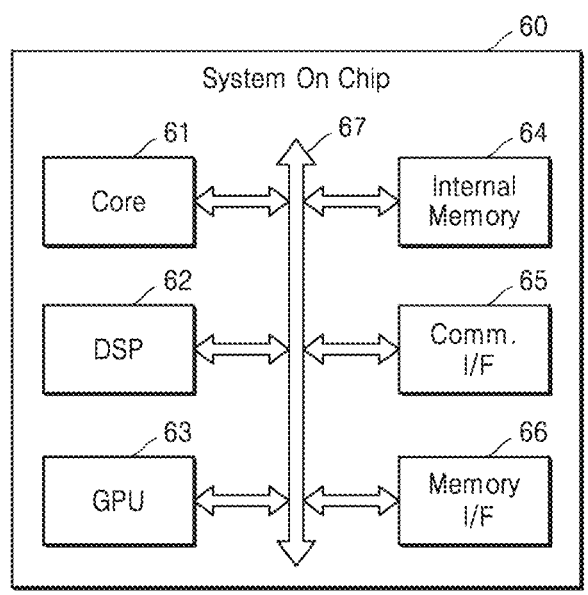
FIG. 14 is a block diagram of a system-on-chip including a memory device according to an example embodiment of the inventive concepts.

FIG. 14 is a block diagram of a system-on-chip (SoC) 60 including a memory device according to an example embodiment of the inventive concepts. The SoC 60 may refer to an integrated circuit that integrates components of a computing system or other electronic system. For example, an application processor (AP) as one of the SoC 60 may include components for a processor and other functions. As shown in FIG. 14, the SoC 60 may include a core 61, a digital signal processor (DSP) 62, a graphic processing Unit (GPU) 63, an internal memory 64, a communication interface 65, and a memory interface 66. The components of the SoC 60 may communicate with each other via a bus 67.

The core 61 may process instructions and may control operations of components included in the SoC 60. For example, the core 61 may drive an operating system and execute applications on the operating system by processing a series of instructions. The DSP 62 may generate useful data by processing digital signals, for example, the digital signals provided from the communication interface 65. The GPU 63 may generate data for an image output from image data provided from the internal memory 64 or the memory interface 66 through a display device and may encode the image data.

The internal memory 64 may store data necessary for an operation of the core 61, the DSP 62, and/or the GPU 63. The internal memory 64 may include a resistive memory device according to an example embodiment of the inventive concepts resistive, so that the internal memory 64 may have improved speed and reliability.

The communication interface 65 may provide a communication network or an interface for one-to-one communication. The memory interface 66 may provide an interface to an external memory of the SoC 60, for example, dynamic random access memory (DRAM), a flash memory, and the like.

Example embodiments have been illustrated and described in the drawings and the detailed description as described above. Although the specific terms are used to explain these example embodiments in the present disclosure, the specific terms are not intended to restrict the scope of the inventive concepts and are only used for a better understanding of the inventive concepts. It will be understood by those of ordinary skill in the art that various changes in form and details may be made without departing from the spirit and scope of the inventive concepts as defined by the appended claims. Therefore, the scope of the inventive concepts is defined not by the detailed description of the inventive concepts but by the appended claims.

What is claimed is:

1. A resistive memory device configured to output a value stored in a memory cell in response to a read command, the resistive memory device comprising:
   a cell array comprising a memory cell and a reference cell;
   a reference resistor circuit configured to be electrically connected to the reference cell during a read operation;
   a current source circuit configured to provide currents to the memory cell, the reference cell, and the reference resistor circuit according to a read control signal; and
   a control circuit configured to generate the read control signal such that a pumping current is provided to the reference resistor circuit in an initial period of the read operation.

2. The resistive memory device of claim 1, wherein the control circuit is further configured to generate the read control signal such that precharge currents are provided to the memory cell and the reference cell, respectively, in the initial period of the read operation.

3. The resistive memory device of claim 2, wherein the current source circuit comprises current sources having the same structure as each other and configured to generate the precharge currents, respectively.

4. The resistive memory device of claim 1, wherein the control circuit is further configured to control the current source circuit such that read currents are provided to the memory cell and the reference cell, respectively, at the end of the initial period of the read operation.

5. The resistive memory device of claim 4, wherein the current source circuit comprises current sources having the same structure as each other and configured to generate the read currents, respectively.

6. The resistive memory device of claim 1, further comprising:
   an equalization switch configured to electrically connect the memory cell to the reference cell according to the read control signal, and
   the control circuit is further configured to generate the read control signal such that the equalization switch is turned on in the initial period of the read operation.

7. A method of operating a resistive memory device comprising a memory cell, a reference cell, and a reference resistor circuit, the method comprising:
   electrically connecting the reference cell to the reference resistor circuit in response to a read command;
   providing precharge currents to the memory cell and the reference cell, respectively, and providing a pumping current to the reference resistor circuit;
   providing read currents to the memory cell and the reference cell, respectively, and interrupting the pumping current; and
   comparing voltages according to the read currents to produce a comparison signal.

8. The method of claim 7, further comprising:
   electrically connecting the memory cell to the reference cell while the precharge currents are being provided.

9. The method of claim 7, wherein the pumping current is greater than each of the precharge currents.

\* \* \* \* \*